(12) United States Patent
Ji et al.

(10) Patent No.: US 10,607,764 B2
(45) Date of Patent: Mar. 31, 2020

(54) ELECTRONIC COMPONENT AND SYSTEM-IN-PACKAGE

(71) Applicant: SAMSUNG ELECTRO-MECHANICS CO., LTD., Suwon-Si, Gyeonggi-Do (KR)

(72) Inventors: Soo Young Ji, Suwon-Si (KR); Hwan Soo Yoo, Suwon-Si (KR); Nam Soon Moon, Suwon-si (KR); Jeong Suong Yang, Suwon-si (KR); Tae Ho Kim, Suwon-si (KR); Dae Chul Choi, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 90 days.

(21) Appl. No.: 15/783,798

(22) Filed: Oct. 13, 2017

(65) Prior Publication Data

US 2018/0286559 A1    Oct. 4, 2018

(30) Foreign Application Priority Data

Mar. 29, 2017  (KR) .................. 10-2017-0039998

(51) Int. Cl.
| | | |
|---|---|---|
| H01F 5/00 | (2006.01) | |
| H01F 27/255 | (2006.01) | |
| H01F 27/29 | (2006.01) | |
| H05K 1/18 | (2006.01) | |
| H01F 27/28 | (2006.01) | |
| H01F 17/00 | (2006.01) | |
| H01F 17/04 | (2006.01) | |

(52) U.S. Cl.
CPC ....... *H01F 27/255* (2013.01); *H01F 17/0013* (2013.01); *H01F 27/2804* (2013.01); *H01F 27/292* (2013.01); *H05K 1/181* (2013.01); *H01F 2017/048* (2013.01); *H05K 2201/1003* (2013.01)

(58) Field of Classification Search
CPC .. H01F 17/0006; H01F 27/255; H01F 27/292; H01F 27/2804; H05K 1/181; H05K 2201/1003
USPC ........................................ 336/192, 200, 233
See application file for complete search history.

(56) References Cited

U.S. PATENT DOCUMENTS

| | | | | |
|---|---|---|---|---|
| 5,866,196 A | * | 2/1999 | Ueno | C04B 35/47 427/79 |
| 6,214,685 B1 | * | 4/2001 | Clinton | H01C 1/034 438/382 |
| 10,304,630 B2 | * | 5/2019 | Inoue | C09D 163/00 |
| 2003/0099085 A1 | * | 5/2003 | Duva | H01G 2/12 361/311 |
| 2011/0002082 A1 | * | 1/2011 | Bultitude | H01G 4/005 361/306.3 |

(Continued)

FOREIGN PATENT DOCUMENTS

| | | |
|---|---|---|
| KR | 10-0836645 B1 | 6/2008 |
| KR | 10-1550591 B1 | 9/2015 |
| KR | 10-1652848 B1 | 8/2016 |

*Primary Examiner* — Mang Tin Bik Lian
(74) *Attorney, Agent, or Firm* — Morgan, Lewis & Bockius LLP

(57) ABSTRACT

An electronic component includes: a body having electrical insulating properties; an external electrode disposed on an external surface of the body; and a reinforcing layer disposed on a surface of the body and including a metal oxide layer and a graphene oxide layer.

16 Claims, 6 Drawing Sheets

(56) References Cited

U.S. PATENT DOCUMENTS

| | | | |
|---|---|---|---|
| 2013/0222101 A1* | 8/2013 | Ito | H01F 17/04 |
| | | | 336/83 |
| 2013/0293334 A1* | 11/2013 | Shin | H01F 1/26 |
| | | | 336/192 |
| 2014/0145816 A1 | 5/2014 | Sato et al. | |
| 2016/0225513 A1 | 8/2016 | Park et al. | |
| 2017/0084376 A1* | 3/2017 | Kubota | H01F 17/00 |

\* cited by examiner

I-I'

A

ELECTRONIC COMPONENT AND SYSTEM-IN-PACKAGE

CROSS-REFERENCE TO RELATED APPLICATION(S)

This application claims the benefit of priority to Korean Patent Application No. 10-2017-0039998 filed on Mar. 29, 2017 in the Korean Intellectual Property Office, the disclosure of which is incorporated herein by reference in its entirety.

BACKGROUND

1. Field

The present disclosure relates to an electronic component and a system-in-package.

2. Description of Related Art

Recently, in accordance with increased complexity and the multifunctionalization of electronic products, electronic product components have also been required to have a small size, be able to handle a high current, and have high capacity. For example, when a size of a coil is reduced in order to miniaturize a power inductor, a volume of a body region in which a central portion of a core of the coil is formed is also reduced. However, when the volume of the central portion of the core is reduced, the inductor is vulnerable to external stress or thermal impacts.

In addition, a system-in-package (SiP) in which several chips are packaged simultaneously has been used in order to implement a high-capacity/small product for significantly reducing a module area in the electronic component set and to increase added value. A system-in-package may secure high performance and excellent electrical characteristics, since a length of a path between elements may be reduced. In addition, due the use of the system-in-package, a design of a mounting substrate may be simplified, and a size of the electronic product may be reduced.

SUMMARY

An aspect of the present disclosure may provide an electronic component capable of reducing a defect such as delamination, cracking, or the like, by improving rigidity characteristics of the electronic component. An aspect of the present disclosure may also provide a system-in-package having high reliability by using such an electronic component.

According to an aspect of the present disclosure, an electronic component may include: a body having electrical insulating properties; an external electrode disposed on an external surface of the body; and a reinforcing layer disposed on a surface of the body and including a metal oxide layer and a graphene oxide layer.

The metal oxide layer may be in contact with the body, and a material constituting the metal oxide layer and a material constituting the body may form a chemical bond therebetween.

The material constituting the metal oxide layer and the material constituting the body may form a covalent bond therebetween.

The body may include a polymer.

The body may further include a plurality of magnetic particles dispersed in the polymer.

The metal oxide layer and the graphene oxide layer may form a chemical bond therebetween.

The metal oxide layer and the graphene oxide layer may form a covalent bond therebetween.

A thickness of the reinforcing layer may be the same as a thickness of the external electrode.

The reinforcing layer may have a structure in which the metal oxide layer and the graphene oxide layer are stacked in a thickness direction.

The reinforcing layer may have a form in which the metal oxide layer and the graphene oxide layer are alternately stacked repeatedly two or more times.

The graphene oxide layer may be disposed on an outermost side of the reinforcing layer.

A pair of external electrodes may be provided and are spaced apart from each other, and the reinforcing layer may be disposed between the pair of external electrodes.

The reinforcing layer and the external electrode may have the same thickness in relation to the surface of the body.

In the metal oxide layer, a metal component may be at least one selected from the group consisting of Ti, Al, Ge, Co, Ca, Hf, Fe, Ni, Nb, Mo, La, Re, Sc, Si, Ta, W, Y, Zr, and V.

The electronic component may further include a coil part disposed in the body.

The electronic component of claim 1, wherein the reinforcing layer is disposed on upper, lower and side surfaces of the body.

According to another aspect of the present disclosure, a system-in-package may include: a substrate; an electronic component disposed on the substrate and including a body having electrical insulating properties, an external electrode disposed on an external surface of the body, and a reinforcing layer disposed on a surface of the body and including a metal oxide layer and a graphene oxide layer; and an encapsulant encapsulating the electronic component.

At least one of the metal oxide layer and the graphene oxide layer may form a chemical bond to the encapsulant.

At least one of the metal oxide layer and the graphene oxide layer may form a covalent bond to the encapsulant.

The encapsulant may include a polymer.

The metal oxide layer may be in contact with the body, and a material constituting the metal oxide layer and a material constituting the body may form a chemical bond therebetween.

The metal oxide layer may be in contact with the body, and a material constituting the metal oxide layer and a material constituting the body may form a covalent bond therebetween.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Figure 1:
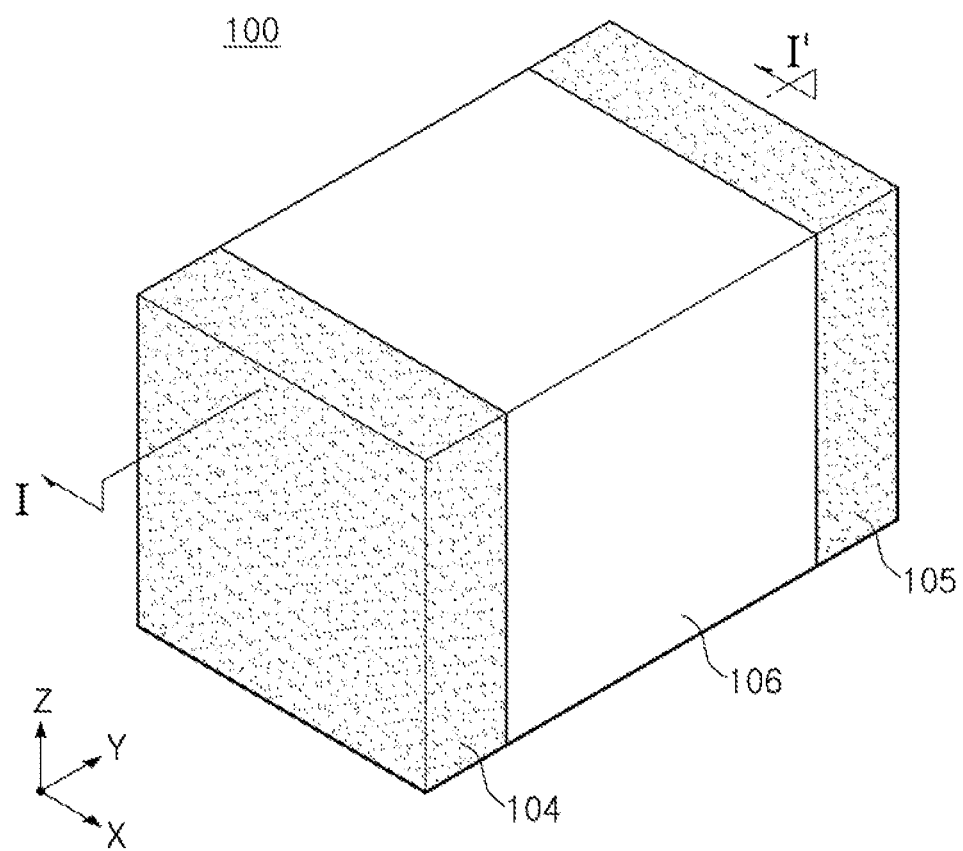
FIG. 1 is a schematic perspective view illustrating an electronic component according to an exemplary embodiment in the present disclosure.
Figure 2:
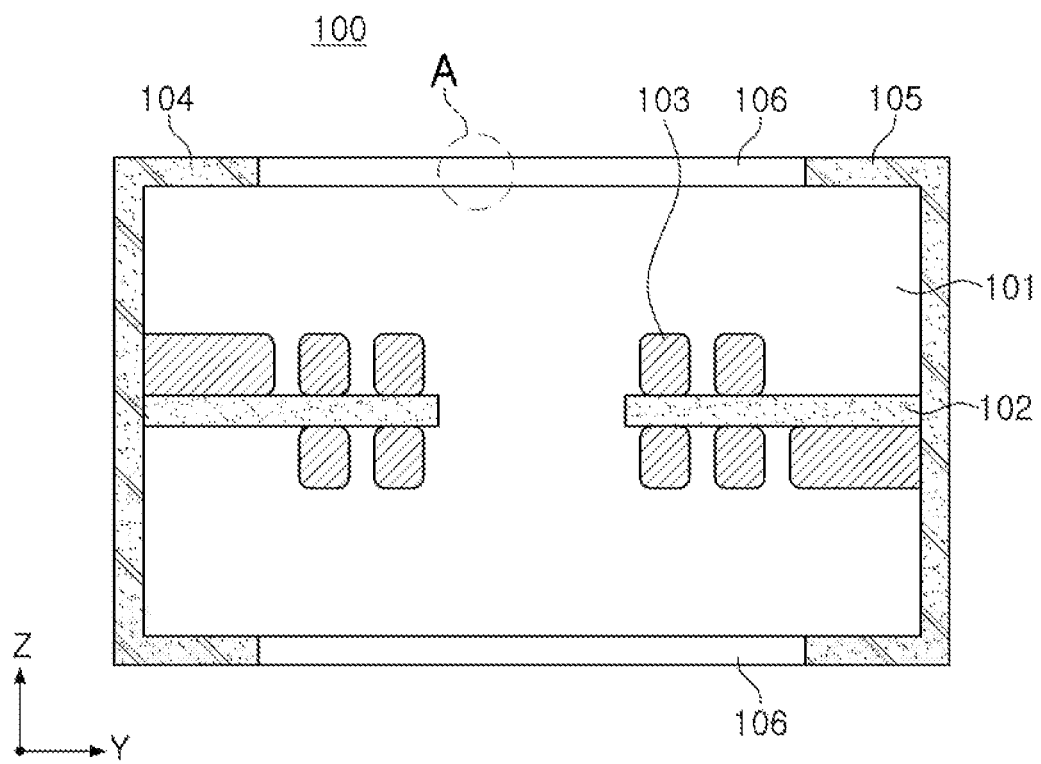
FIG. 2 is a cross-sectional view of the electronic component taken along line I-I' of FIG. 1.
Figure 3:
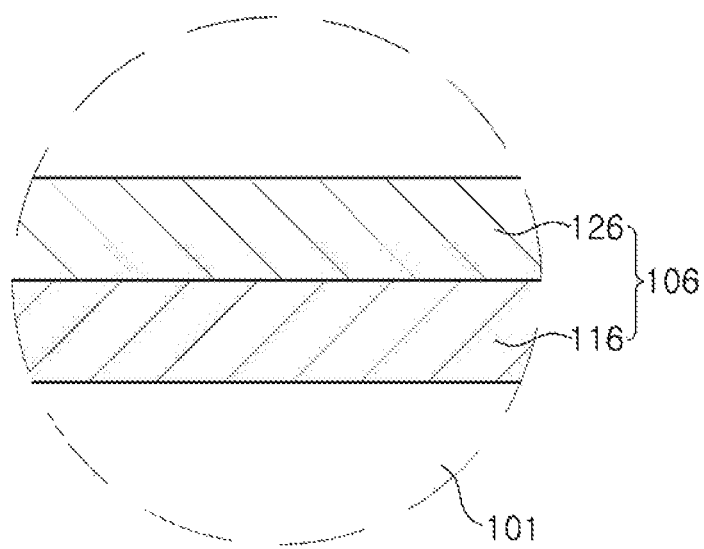
FIG. 3 is a cross-sectional view illustrating a reinforcing layer that may be used in the electronic component of FIG. 1.

FIG. 1 is a schematic perspective view illustrating an electronic component according to an exemplary embodiment in the present disclosure. FIG. 2 is a cross-sectional view of the electronic component taken along line I-I' of FIG. 1. FIG. 3 is a cross-sectional view illustrating a reinforcing layer that may be used in the electronic component of FIG. 1.

First, referring to FIGS. 1 and 2, the electronic component 100 may include a body 101, external electrodes 104 and 105, and reinforcing layers 106. An example of the electronic component 100 is an inductor including coil patterns as illustrated in the present exemplary embodiment. In detail, the electronic component 100 may include an element substrate 102 and a coil part 103 disposed in the body 101. The coil part 103 may be formed on the element substrate 102 and may be connected to the external electrodes 104 and 105. However, the electronic component 100 may also have structures of various elements such as a capacitor, a resistor, a composite electronic component, and the like, in addition to an inductor.

The body 101 may embed the coil part 103, and the like, therein, and may have electrical insulating properties. The body 101 may include, for example, a polymer as a material constituting the body 101. In addition, a plurality of magnetic particles dispersed in the polymer may be included in the body 101 in order to improve a magnetic property. In this case, an epoxy resin, which is a thermosetting resin, may be used as the polymer included in the body 101, and a polyimide resin, or the like, may be used as another example of the thermosetting resin. As described below, the body 101 may form chemical bonds on interfaces between the body 101 and materials constituting the reinforcing layers 106. Therefore, a bonding strength between the body 101 and the reinforcing layers 106, rigidity of the body 101, and the like, may be improved. The reinforcing layers 106 may be disposed on upper, lower and side surfaces of the body 101.

A pair of external electrodes 104 and 105 may be provided, and may be disposed on external surfaces of the body 101. The external electrodes 104 and 105 may be connected to the coil part 103, and may be formed of a metal having high electrical conductivity. The external electrodes 104 and 105 may also be formed in a multilayer structure, if necessary. A thickness of the reinforcing layer 106 may be the same as a thickness of the external electrodes 104 and 105.

The reinforcing layers 106 may be disposed on surfaces of the body 101, and may be disposed, respectively, on surfaces of the body 101 opposing each other, as in the present exemplary embodiment. As in a form illustrated in FIG. 3, the reinforcing layer 106 may be formed in a multilayer structure. In detail, the reinforcing layer 106 may include a metal oxide layer 116 and a graphene oxide layer 126. In this case, the reinforcing layer 106 may have a structure in which the metal oxide layer 116 and the graphene oxide layer 126 are stacked in a thickness direction.

The metal oxide layer 116 may be formed on the surface of the body 101 to protect the body 101 and improve rigidity of the electronic component 100. To this end, the metal oxide layer 116 may be in contact with the body 101, and a material constituting the metal oxide layer 116 and a material constituting the body 101 may form a chemical bond therebetween. As described above, the chemical bond rather than a physically separated structure may be formed, such that bonding force between the metal oxide layer 116 and the body 101 is improved, resulting in improvement of mechanical stability of the electronic component 100. Furthermore, the chemical bond may be a covalent bond. That is, the material constituting the metal oxide layer 116 and the material constituting the body 101 may form a covalent bond therebetween.

The metal oxide layer 116 may include a metal alkoxide component in order to form the chemical bond to the body 101. For example, such a metal alkoxide component may be an alkoxide silane compound containing an amino functional group that may be covalently bonded to the polymer of the body 101 or the graphene oxide layer 126. In the metal oxide layer 116, the metal alkoxide component may be at least one selected from the group consisting of Ti, Al, Ge, Co, Ca, Hf, Fe, Ni, Nb, Mo, La, Re, Sc, Si, Ta, W, Y, Zr, and V. A typical example of these metal alkoxide components may be Si. In this case, the metal alkoxide compound containing the amino functional group may be N-(2-aminoethyl-3-aminopropyl)trimethoxysilane ($C_8H_{22}N_2O_3Si$), N-methyl-3-aminopropyltrimethoxysilane ($C_7H_{19}NO_3Si$), 4-(diethoxymethylsilyl)butylamine ($C_9H_{23}NO_2Si$), 3-glycidoxypropyltrimethoxysilane ($C_9H_{20}O_5Si$), 1-[2-(trimethoxysilyl)ethyl]cyclohexane-3,4-epoxide ($C_{11}H_{22}O_4Si$), or the like. The metal oxide layer 116 having the metal alkoxide component described above may form the chemical bond to the body 106 in a hardening process. However, the chemical body may also be formed by another process that may be used in the related art.

Figure 4:
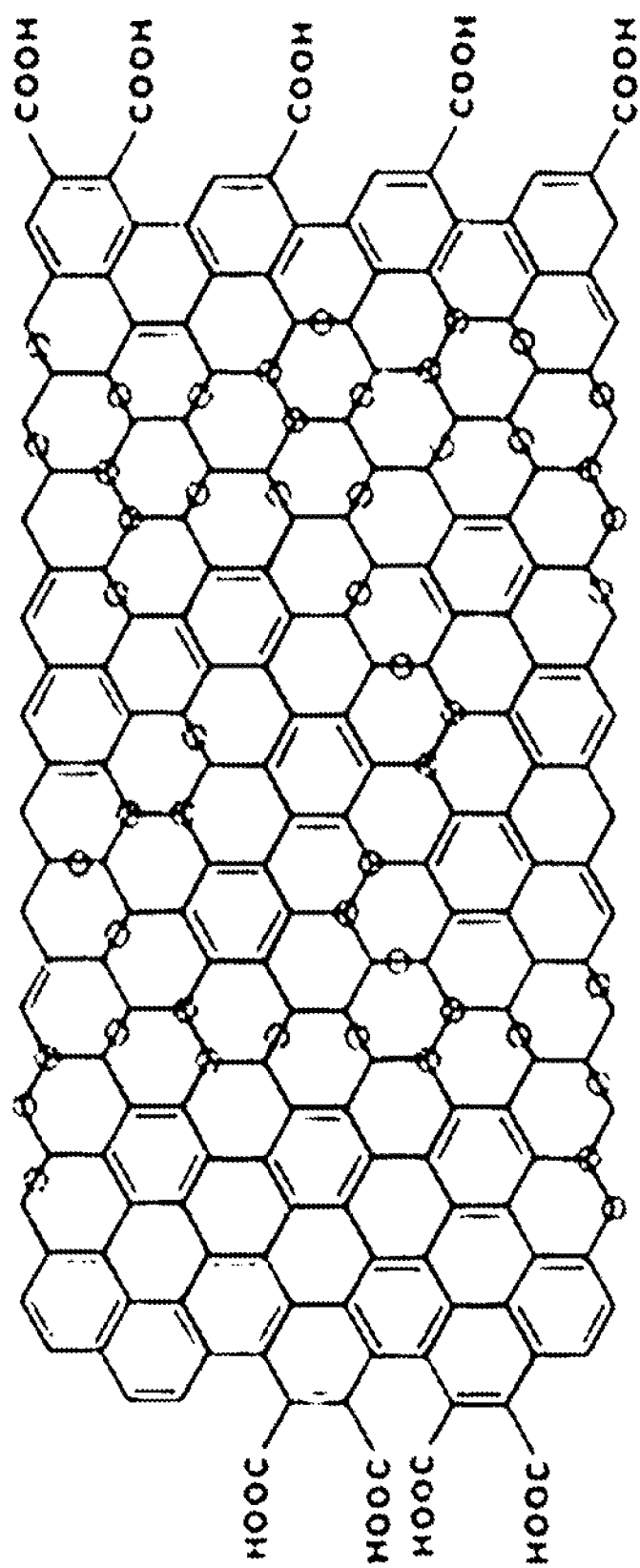
FIG. 4 is a view illustrating a surface structure of a graphene oxide layer.

The graphene oxide layer 126 may have high rigidity to further improve mechanical characteristics of the electronic component 100, and may have rigidity higher than that of the metal oxide layer 116. In this case, the graphene oxide layer 126 may form a chemical bond with the metal oxide layer 116, such that bonding force between the graphene oxide layer 126 and the metal oxide layer 116 may be further improved. The chemical bond may be a covalent bond. The graphene oxide layer 126 may have an epoxy group, as in a form illustrated in FIG. 4, in order to form the chemical bond to the metal oxide layer 116. FIG. 4 is a view illustrating a surface structure of a graphene oxide layer. Like the metal oxide layer 116, the graphene oxide layer 126 may form the chemical bond with the metal oxide layer 116 in a hardened process. In this case, the body 101, the metal oxide layer 116, and the graphene oxide layer 126 may be simultaneously hardened.

Although not necessary, the graphene oxide layer 126 of the metal oxide layer 116 and the graphene oxide layer 126 may be disposed on an outermost side of the reinforcing layer 106. The graphene oxide layer 126 having relatively higher rigidity may be disposed at an outer side significantly affected by external stress to implement a further enhanced rigidity effect.

Meanwhile, as in a form illustrated in FIGS. 1 and 2, the reinforcing layer 106 may be disposed between the pair of external electrodes 104 and 105. In this case, the reinforcing layer 106 and the external electrodes 104 and 105 may have the same thickness in relation to the surface of the body 101 in order to provide structural stability.

Figure 5:
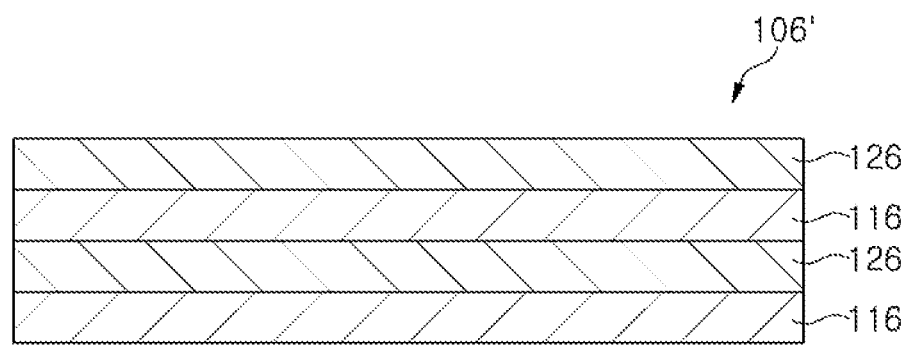
FIGS. 5 and 6 are cross-sectional views illustrating other examples of a reinforcing layer that may be used in the electronic component of FIG. 1.
Figure 6:
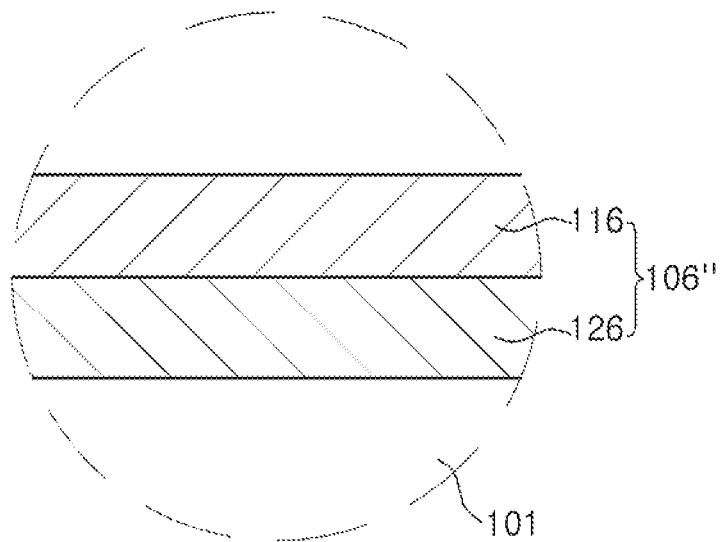

FIGS. 5 and 6 are cross-sectional views illustrating other examples of a reinforcing layer that may be used in the electronic component of FIG. 1. As in a form illustrated in FIG. 5, in a reinforcing layer 106', metal oxide layers 116 and graphene oxide layers 126 may be alternately stacked repeatedly two times, and the number of stacked metal oxide layers 116 and graphene oxide layers 126 may be further increased depending on a condition such as required rigidity, or the like. In addition, as in a form illustrated in FIG. 6, a stack sequence of a metal oxide layer 116 and a graphene oxide layer 126 may be changed. In other words, in the reinforcing layer 106" according to a modified example, the graphene oxide layer 126 may be first formed on the surface of the body 101, and the metal oxide layer 116 may be formed on the graphene oxide layer 126 to form a chemical bond to the graphene oxide layer 126. Like the metal oxide layer 116, the graphene oxide layer 126 may form a chemical bond to the material constituting the body 101.

Figure 7:
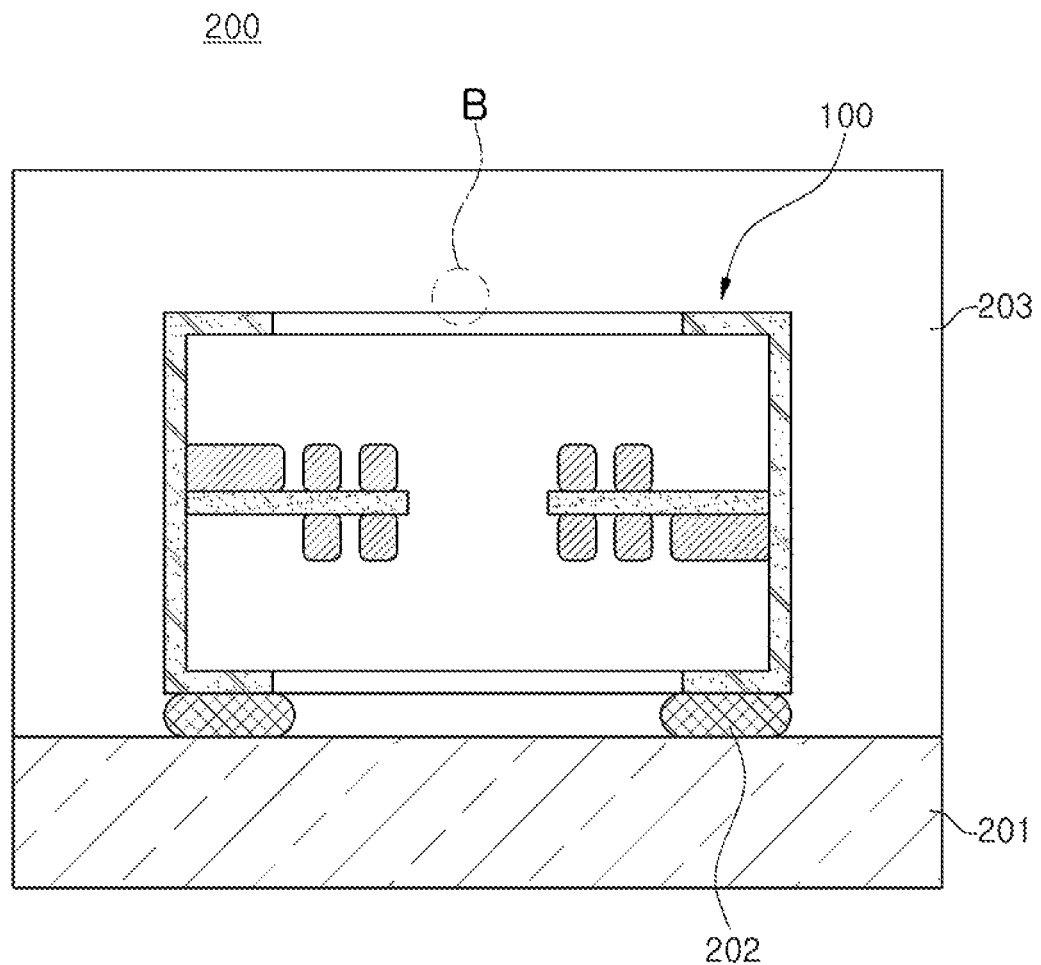
FIG. 7 is a schematic cross-sectional view illustrating a system-in-package (SiP) according to an exemplary embodiment in the present disclosure.
Figure 8:
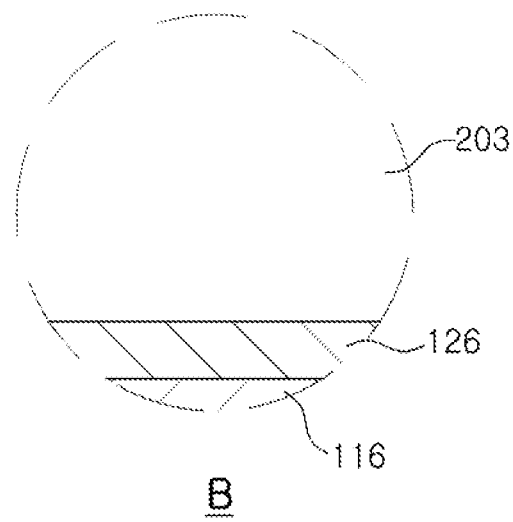
FIG. 8 is a view illustrating a reinforcing layer and an encapsulant that may be used in the system-in-package of FIG. 7.

FIG. 7 is a schematic cross-sectional view illustrating a system-in-package (SiP) according to an exemplary embodiment in the present disclosure. FIG. 8 is a view illustrating a reinforcing layer and an encapsulant that may be used in the system-in-package of FIG. 7.

Referring to FIGS. 7 and 8, the system-in-package 200 may include a substrate 201 and an electronic component 100 and an encapsulant 203 disposed on the substrate 201, and the electronic component 100 may have the structure described above with reference to FIG. 2. Therefore, a description for a detailed form of the electronic component 100 may be replaced with the abovementioned description.

The substrate 201, which is a component mounting substrate that may be used in the system-in-package 200, may be a printed circuit board (PCB), or the like. The electronic component 100 may be mounted on the substrate 201 by an adhesive electrical connection layer 202 such as a solder. In this case, only one electronic component 100 is illustrated in FIG. 7, but components other than the electronic component 100, such as a capacitor, an inductor, and the like, may be further included in the system-in-package 200.

The encapsulant 203 may encapsulate the electronic component 100 to protect the electronic component 100, and may also encapsulate other components to implement the system-in-package 100. The encapsulant 203 may include a polymer, and may further include a functional filler. The functional filler may be added in order to improve mechanical, electrical, and magnetic characteristics, and may be, for example, silica ($SiO_2$). As in a form illustrated in FIG. 7, the reinforcing layer and the encapsulant 203 may be in contact with each other, and at least one of the metal oxide layer 116 and the graphene oxide layer 126 may form a chemical bond with the encapsulant 203. The chemical bond may be a covalent bond. As in a form illustrated in FIG. 8, an example in which the graphene oxide layer 126 forms a chemical bond with the encapsulant 203 is illustrated in the present exemplary embodiment.

As described above, the chemical bond may be formed in each of regions between the encapsulant 203 and the graphene oxide layer 126, between the graphene oxide layer 126 and the metal oxide layer 116, and between the metal oxide layer 116 and the body 101, such that bonding force between the respective components constituting the system-in-package 200 is increased, resulting in improvement of mechanical stability of the system-in-package. In the system-in-package 200 of which the mechanical stability is improved as described above, it is less likely that a defect such as delamination or a crack occurs when external stress depending on generation of deformation (particularly, deformation in a horizontal direction in FIG. 2) acts on the system-in-package 200.

Figure 9:
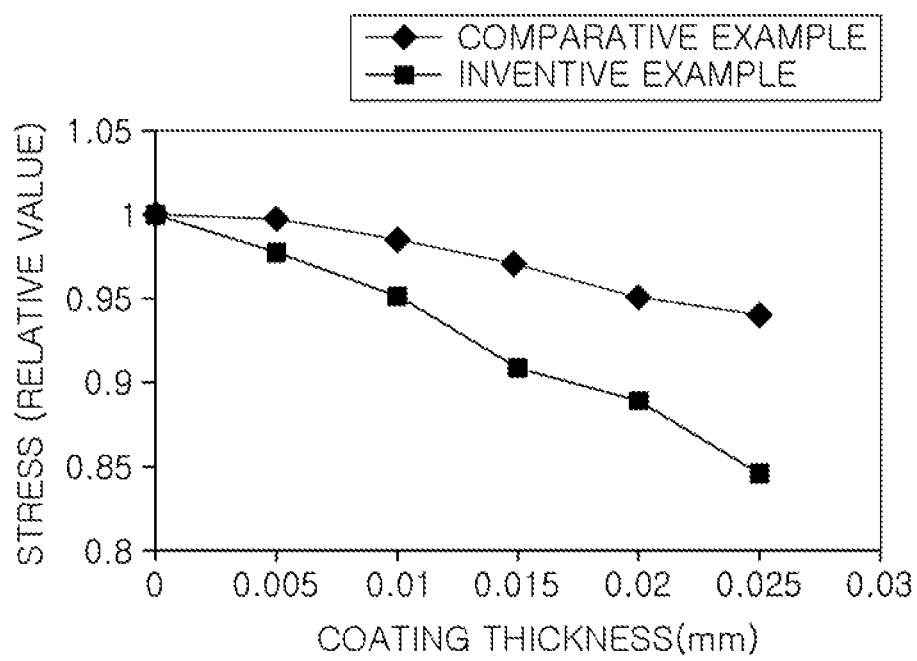
FIG. 9 is a graph illustrating stress reducing rate characteristics of electronic components according to an Inventive Example and a Comparative Example.

FIG. 9 is a graph illustrating stress reducing rate characteristics of electronic components according to an Inventive Example and a Comparative Example. In the Inventive Example, a structure in which two metal oxide layers and two graphene layers are alternately stacked was used as a reinforcing layer, and $SiO_2$ was used as a material of the metal oxide layer. In the Comparative Example, a reinforcing layer was formed at the same thickness as that of the reinforcing layer of Inventive Example, and was formed of only $SiO_2$. As seen from the graphs of FIG. 9, it may be confirmed that as the thickness of the reinforcing layer is increased, an influence of stress on the electronic component is reduced, and a stress reducing effect is larger, particularly in the Inventive Example, in which the metal oxide layers and the graphene oxide layers are alternately stacked, than in the Comparative Example. In a case in which stress of 90% or less acts on the electronic component (in a case in which a coating thickness is 0.02 mm or more), generation of cracks was significantly reduced as compared to a case in which a reinforcing layer is not used, and when considering such a fact, a thickness of the reinforcing layer may be 0.02 mm or more.

As set forth above, in a case of using the electronic component according to the exemplary embodiment in the present disclosure, defects such as delamination, cracking, or the like, may be reduced, and the system-in-package having high reliability may be implemented using such an electronic component.

While exemplary embodiments have been shown and described above, it will be apparent to those skilled in the art that modifications and variations could be made without departing from the scope of the present invention as defined by the appended claims.

What is claimed is:

1. An electronic component comprising:
   a body having electrical insulating properties;
   an external electrode disposed on an external surface of the body; and
   a reinforcing layer disposed on a surface of the body and including a metal oxide layer and a graphene oxide layer,
   wherein the metal oxide layer is in contact with the body, and
   a metal oxide constituting the metal oxide layer and a polymer constituting the body form a chemical bond therebetween.

2. The electronic component of claim 1, wherein the body further includes a plurality of magnetic particles dispersed in the polymer.

3. The electronic component of claim 1, wherein the metal oxide layer and the graphene oxide layer form a chemical bond therebetween.

4. The electronic component of claim 1, wherein the reinforcing layer includes the metal oxide layer and the graphene oxide layer stacked in a thickness direction.

5. The electronic component of claim 4, wherein the reinforcing layer includes the metal oxide layer and the graphene oxide layer alternately stacked repeatedly two or more times.

6. The electronic component of claim 5, wherein the graphene oxide layer is disposed on an outermost side of the reinforcing layer.

7. The electronic component of claim 1, wherein a pair of external electrodes are provided and are spaced apart from each other, and the reinforcing layer is disposed between the pair of external electrodes.

8. The electronic component of claim 7, wherein the reinforcing layer and the external electrode have the same thickness in relation to the surface of the body.

9. The electronic component of claim 1, wherein in the metal oxide layer, a metal component is at least one selected from the group consisting of Ti, Al, Ge, Co, Ca, Hf, Fe, Ni, Nb, Mo, La, Re, Sc, Si, Ta, W, Y, Zr, and V.

10. The electronic component of claim 1, further comprising a coil part disposed in the body.

11. The electronic component of claim 1, wherein a thickness of the reinforcing layer is 0.02 mm or more.

12. The electronic component of claim 1, wherein the material constituting the metal oxide layer and the material constituting the body form a covalent bond therebetween.

13. The electronic component of claim 3, wherein the metal oxide layer and the graphene oxide layer form a covalent bond therebetween.

14. The electronic component of claim 1, wherein the reinforcing layer is disposed on upper, lower and side surfaces of the body.

15. A system-in-package comprising:
   a substrate;
   an electronic component disposed on the substrate and including a body having electrical insulating properties, an external electrode disposed on an external surface of the body, and a reinforcing layer disposed on a surface of the body and including a metal oxide layer and a graphene oxide layer; and
   an encapsulant encapsulating the electronic component, wherein the metal oxide layer is in contact with the body, and
   a metal oxide constituting the metal oxide layer and a polymer constituting the body form a chemical bond therebetween.

16. The system-in-package of claim 15, wherein at least one of the metal oxide layer and the graphene oxide layer forms a chemical bond with the encapsulant.

* * * * *